United States Patent
Kawara et al.

[11] Patent Number: 6,133,673
[45] Date of Patent: Oct. 17, 2000

[54] ENERGY TRAP TYPE PIEZOELECTRIC RESONATOR

[75] Inventors: Ryoichi Kawara, Toyama; Nobuhiro Kitajima, Toyama-ken; Kenichi Sakai, Toyama, all of Japan

[73] Assignee: Murata Manufacturing Co., Ltd., Japan

[21] Appl. No.: 09/431,359

[22] Filed: Nov. 1, 1999

[30] Foreign Application Priority Data

Nov. 2, 1998 [JP] Japan ................................ 10-312125

[51] Int. Cl.[7] ...................................................... H01L 41/08
[52] U.S. Cl. ......................... 310/320; 310/365; 310/368; 310/369
[58] Field of Search ................................... 310/311, 320, 310/367, 368, 369, 365, 366

[56] References Cited

U.S. PATENT DOCUMENTS

| | | |
|---|---|---|
| 3,396,287 | 8/1968 | Horton ................................ 310/320 X |
| 3,747,176 | 7/1973 | Toyoshima ........................... 310/320 X |
| 4,365,181 | 12/1982 | Yamamoto ............................... 310/320 |
| 4,876,476 | 10/1989 | Kittaki et al. ............................ 310/320 |
| 5,118,980 | 6/1992 | Takahashi ................................ 310/320 |
| 5,166,570 | 11/1992 | Takahashi ................................ 310/320 |

*Primary Examiner*—Mark O. Budd
*Attorney, Agent, or Firm*—Keating & Bennett LLP

[57] ABSTRACT

An energy trap type piezoelectric resonator includes a plate-like piezoelectric resonator element constructed to vibrate in a third harmonic of a longitudinal vibration mode in a thickness direction thereof and such that both main surfaces of the resonator element are laminated with sealing substrates. Sealed spaces are provided so as to allow a vibrating portion of oppositely disposed vibrating electrodes to vibrate. Sealing portions, in which the piezoelectric resonator element and the sealing substrates are joined and connected around the sealed spaces, are constructed so that when the thickness of a piezoelectric substrate is represented by t and the shortest distance to the sealing portion from the vibrating electrodes is d, the sealed spaces satisfy the relationship $0 < d/t < 5$.

15 Claims, 5 Drawing Sheets

ENERGY TRAP TYPE PIEZOELECTRIC RESONATOR

BACKGROUND OF THE INVENTION

1. Field of the Invention

The present invention relates to an energy trap type piezoelectric resonator for use in, for example, an oscillator, a discriminator, a trap filter, and other such apparatuses. More particularly, the present invention relates to an energy trap type piezoelectric resonator having a sealed space arranged to allow a vibrating potion to freely vibrate and to generate a third harmonic of a longitudinal vibration in the thickness direction of the resonator.

2. Description of the Related Art

Energy trap type piezoelectric resonators have been used in oscillators, discriminators, trap circuits, and other such apparatuses. In Japanese Examined Patent Publication No. 4-101507, one example of such an energy trap type piezoelectric resonator is disclosed.

In FIG. 8, a prior art energy trap type piezoelectric resonator is shown. In such a conventional piezoelectric resonator 51, the upper and lower sides of a plate-like piezoelectric resonator element 52 are laminated with sealing substrates 53 and 54.

The piezoelectric resonator element 52 is composed of a piezoelectric substrate 55 and vibrating electrodes 56 and 57 provided on both main surfaces of the piezoelectric substrate 55. The vibrating electrodes 56 and 57 are partially formed on the main surfaces of the piezoelectric substrate 55 and are arranged to face each other with the piezoelectric substrate 55 disposed therebetween.

In the piezoelectric resonator 51, the portion in which the vibrating electrodes 56 and 57 face each other constitutes a vibrating portion. Further, sealed spaces 58 and 59 are provided to allow the vibrating portion to vibrate. At areas around the sealed spaces 58 and 59, the piezoelectric resonator element 52 is bonded to the sealing substrates 53 and 54, for example, with adhesive.

In the piezoelectric resonator 51, when the maximum planar dimension of the above vibrating electrodes 56 and 57 is represented by x and the maximum planar dimension of the sealed spaces is L, the vibrating electrodes 56 and 57 and the sealed spaces 58 and 59 are formed so as to satisfy the relation L=(1.5 to 3.0) x, and the resonance characteristic is thought to be stabilized under this condition.

Further, in Japanese Examined Patent Publication No. 7-70941, an energy trap type piezoelectric resonator of this type is disclosed and includes sealed spaces above and below the piezoelectric substrate which are shifted relative to each other. By adjusting the amount of displacement between the upper and lower sealed spaces, the degree of damping of undesired spurious signals can be adjusted.

The piezoelectric resonator 51 described in Japanese Unexamined Patent Publication No. 4-101507 is characterized by the reduced dispersion in resonance characteristics. That is, when the sealed spaces 58 and 59 are arranged to realize the above-specified dimensional ratio, the sealed spaces 58 and 59 can be correctly formed, and consequently, the dispersion in the resonance characteristics is reduced. Accordingly, in Japanese Unexamined Patent Publication No. 4-101507, nothing is mentioned about the influence of other vibration modes causing spurious signals of a resonance characteristic used.

On the other hand, in the piezoelectric resonator described in Japanese Examined Patent Publication No. 7-70941, the relative positions of the upper and lower sealed spaces are shifted, and as a result, it is possible to adjust the degree of damping of spurious signals. However, because it is necessary to move the positions of the upper and lower sealed spaces with respect to each other, the symmetry of the component is destroyed.

Further, in Japanese Unexamined Patent Publication No. 4-101507 and Japanese Examined Patent Publication No. 7-70941, only a piezoelectric resonator adapted to be vibrated in a fundamental wave of longitudinal vibration mode in the thickness direction is disclosed, and there is no mention of any piezoelectric resonator making use of harmonics of longitudinal vibration in the thickness direction thereof.

SUMMARY OF THE INVENTION

To overcome the above described problems, preferred embodiments of the present invention provide an energy trap type piezoelectric resonator which is adapted to be vibrated in a third harmonic of a longitudinal vibration mode in the thickness direction without affecting the symmetry of the piezoelectric resonator, and such that a fundamental wave is effectively suppressed and excellent resonance characteristics based on the third harmonic are achieved.

One preferred embodiment of the present invention provides an energy trap type piezoelectric resonator adapted to be vibrated in a third harmonic of a longitudinal vibration in the thickness direction thereof, including an energy trap type piezoelectric resonator element having a piezoelectric substrate, first and second vibrating electrodes respectively disposed on a major surface of the piezoelectric substrate and arranged to face each other with the piezoelectric substrate disposed therebetween, and a vibrating portion defined at an area in which the first and second vibrating electrodes face each other with the piezoelectric substrate disposed therebetween. First and second sealing substrates are joined and connected to both major surfaces of the piezoelectric resonator element so as to sandwich the piezoelectric resonator element. Sealed spaces are provided around the first and second vibrating electrodes so as not to inhibit the vibrating portion from being vibrated. Further, sealing portions are provided in which the first and second substrates are joined and connected to the piezoelectric resonator element around the sealed spaces. When the thickness of the piezoelectric substrate is represented by t and the shortest distance to the sealing portions from the external edge of the first and second vibrating electrodes is d, the sealed spaces are constructed to satisfy 0<d/t<5.

Preferably, the first and second sealing substrates are joined and connected to the piezoelectric resonator element with adhesive or other suitable joining material or methods.

Preferably, concave portions are formed on the side of the first and second sealing substrates which are joined and connected to the piezoelectric resonator element, and the concave portions constitute sealed spaces.

Also, insulating layers having a through-hole for defining the sealed spaces, may preferably be disposed between the first and second sealing substrates, and the piezoelectric resonator element and the portions of insulating layers around the through-holes constitute the sealing portions.

Preferably, in the portions constituting the sealed spaces, the first and second sealing substrates are not joined and connected to the piezoelectric resonator element and, in the sealing portion, the first and second sealing substrates are joined and connected to the piezoelectric resonator element with adhesive, so that the sealed spaces are defined around the first and second vibrating electrodes.

Other features and advantages of the present invention will become apparent from the following description of the invention which refers to the accompanying drawings.

DETAILED DESCRIPTION OF PREFERRED EMBODIMENTS

In a piezoelectric resonator element adapted to be vibrated in a third harmonic of a longitudinal vibration in the thickness direction, a fundamental wave and fifth or higher odd harmonics may be generated in addition to a third harmonic. Therefore, when, for example, a piezoelectric oscillator is constructed using the piezoelectric resonator element, there is the possibility that undesired oscillation occurs due to a fundamental wave and fifth or higher odd harmonics.

The above undesired oscillation is able to be avoided to a certain degree by changing the design of the circuit configuration. However, the method of suppressing undesired oscillation generated by a fundamental wave and the method of suppressing undesired oscillation are partially contrary to each other. Further, when the gain frequency characteristic of the oscillation circuit is considered, a low frequency fundamental wave is likely to satisfy the oscillating condition. Therefore, in a piezoelectric resonator element making use of a third harmonic, the suppression of the fundamental wave is strongly desired.

As a method of suppressing a fundamental wave so as not to affect the third harmonic, a method of selectively damping leaked vibrating areas of the fundamental wave by using damping material, etc. can be considered. However, the leaked vibrating areas of the fundamental wave are dependent on the dimensions of vibrating electrodes. Accordingly, highly precise application of damping material is required, and the manufacture process is made very difficult and the number of manufacturing processes is also increased.

In preferred embodiments of the present invention, without any special material such as damping material, etc. and without the use of additional processes, a piezoelectric resonator having a fundamental wave effectively suppressed and making use of a third harmonic of a longitudinal vibration in the thickness direction is provided.

Figure 1A:
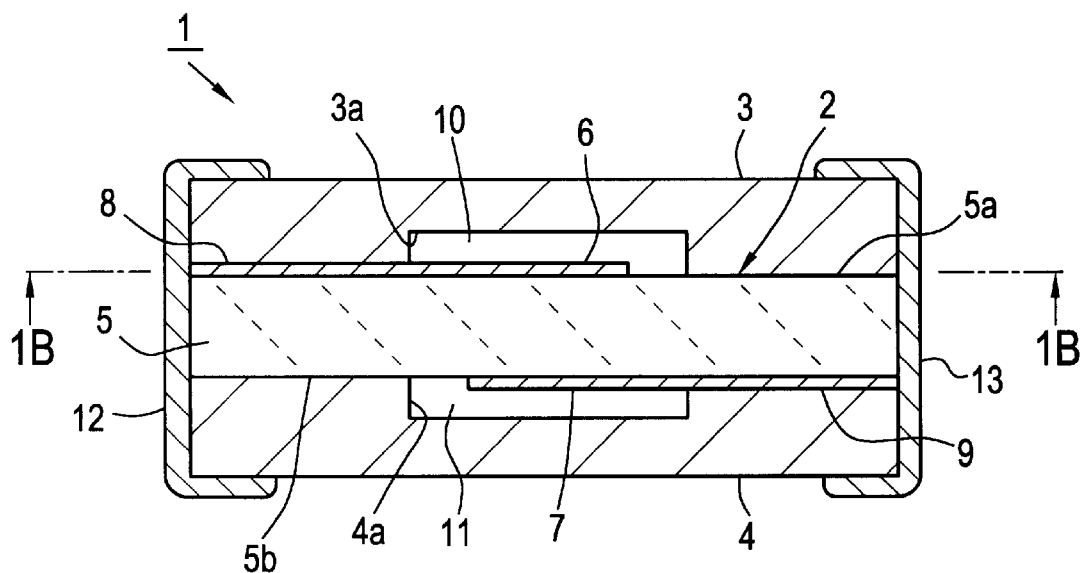
FIG. 1A is a sectional side view of an energy trap type piezoelectric resonator according to a first preferred embodiment of the present invention.
Figure 1B:
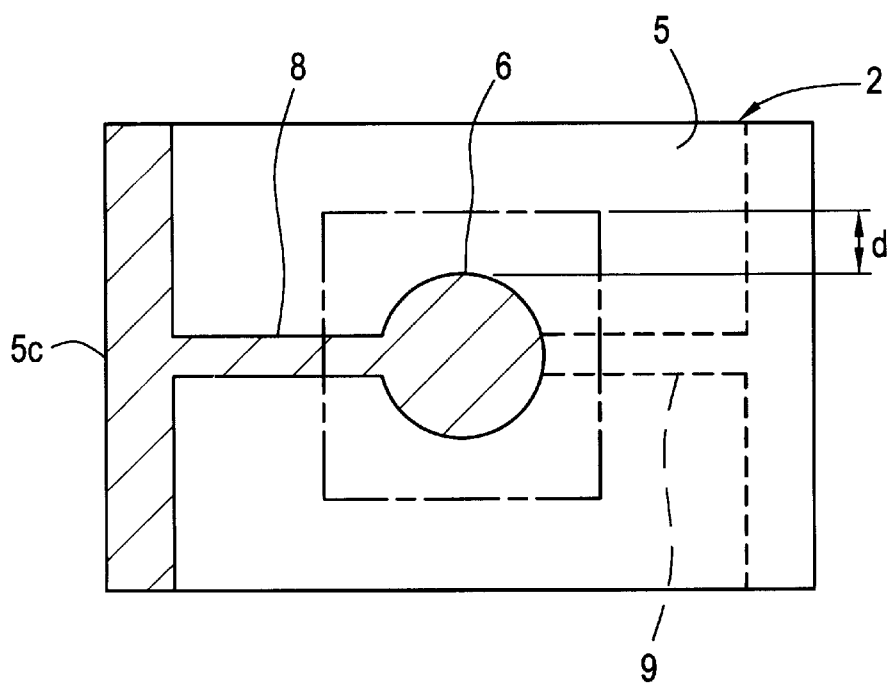
FIG. 1B is a top sectional view taken on line A—A of FIG. 1A, respectively.

FIGS. 1A and 1B are a sectional side view of a piezoelectric resonator according to a first preferred embodiment of the present invention and a sectional view taken along line A—A of FIG. 1A, respectively.

In an energy trap type piezoelectric resonator 1 of the present preferred embodiment, first and second sealing substrates 3 and 4 are joined and connected to both main surfaces of a plate-like energy trap type piezoelectric resonator element 2 so as to sandwich the piezoelectric resonator element 2 therebetween.

The piezoelectric resonator element 2 preferably includes a substantially rectangular piezoelectric substrate 5. The piezoelectric substrate 5 can be made of piezoelectric ceramics such as lead zirconate titanate type ceramics or a piezoelectric single crystal, such as quartz, or other suitable material.

In an approximately central portion of an upper surface 5a of the piezoelectric substrate 5, a first vibrating electrode 6 is preferably provided. In the approximately central portion of a lower surface 5b of the piezoelectric substrate, a second vibrating electrode 7 is preferably provided. The first vibrating electrode 6 and second vibrating electrode 7 are arranged to face each other with the piezoelectric substrate 5 disposed therebetween.

Further, as clearly understood from FIG. 1B, the first vibrating electrode preferably has a substantially circular shape and is electrically connected to a lead-out electrode 8. The lead-out electrode 8 is arranged so as to extend to one edge 5c and along the edge 5c in the vicinity of the edge 5c.

In the same way, on the lower surface 5b of the piezoelectric substrate 5, the vibrating electrode 7 also preferably has a susbstantially circular shape, and the vibrating electrode 7 is electrically connected to a lead-out electrode 9. The lead-out electrode 9 is arranged to extend to the edge located opposite from the above one edge 5c with the vibrating portion disposed therebetween.

The vibrating electrodes 6 and 7 and lead-out electrodes 8 and 9 are preferably formed by a method for making thin films such as vacuum evaporation, plating or sputtering, or other suitable method and by application of conductive paste.

The first and second sealing substrates 3 and 4 preferably have the same flat shape as the piezoelectric substrate 5 and are preferably made of insulating ceramics such as alumina, or appropriate dielectric ceramics. However, the sealing substrates 3 and 4 may be constructed by using other insulating or dielectric materials such as a synthetic resin, or other suitable material.

In the present preferred embodiment, on the sides of the sealing substrates 3 and 4 which are joined and connected to the piezoelectric substrate 5, concave portions 3a and 4a are preferably provided and arranged to have a substantially rectangular flat shape. The concave potions 3a and 4a constitute sealed spaces 10 and 11 to prevent the vibrating portions from being vibrated.

The concave portions 3a and 4a may be formed by cutting the sealing substrates 3 and 4. Further, the sealing substrates 3 and 4 on which the concave portions 3a and 4a are to be formed may be molded by various molding methods to form the concave portions 3a and 4a.

Further, regarding the sealing substrates 3 and 4, the sides having the concave portions 3a and 4a are bonded to the piezoelectric resonator element 2 with adhesive (not illustrated) or other suitable joining material or methods.

That is, outside of the vibration spaces 10 and 11, the piezoelectric resonator element 2 is joined and connected to the sealing substrates 3 and 4 with adhesive, and in this way, the sealing portions in preferred embodiments of the present invention are defined and positioned outside of the vibration spaces 10 and 11. Accordingly, the internal edges of the sealing portions coincide with the external edges of the vibration spaces 10 and 11.

Further, on opposing end surfaces of a laminate including the piezoelectric resonator element 2 and sealing substrates 3 and 4, external electrodes 12 and 13 are provided. The external electrodes 12 and 13 can be formed by applying appropriate conductive material using an appropriate method such as coating and baking of conductive paste, vacuum evaporation, sputtering, and so on.

The external electrode 12 is electrically connected to the lead-out electrode 8, and the external electrode 13 to the lead-out electrode 9.

In the piezoelectric resonator 1, by applying voltage alternately between the external electrodes 12 and 13, excitation in a longitudinal vibration mode in the thickness direction is applied to the vibrating portion in which the vibrating electrodes 6 and 7 are disposed opposite to each other with the piezoelectric plate 5 disposed therebetween. As a result of the vibrating electrodes 6 and 7 being partially formed on the substrate, the vibration energy is confined substantially inside of the vibrating portion.

In the piezoelectric resonator 1 of the present preferred embodiment, a third harmonic, out of all of the longitudinal vibration modes generated in the thickness direction by the excitation of the vibration portion, is effectively used.

That is, the material constituting the piezoelectric substrate 5, the dimension of the piezoelectric substrate 5, the planar shape and area of the vibrating electrodes 6 and 7, and so on are chosen so that the third harmonic is highly excited. However, when excitation is applied to the vibration portion, not only a third harmonic, but also the fundamental wave and fifth or higher odd harmonics are excited.

One of the advantages achieved by preferred embodiments of the present invention is that of the fundamental wave and fifth or higher odd harmonics, the fundamental wave is effectively suppressed by limiting the dimension of the sealed spaces 10 and 11. That is, when the thickness of the piezoelectric substrate 5 is represented by t and the shortest distance to the sealing portion from the external edge of the vibrating electrodes 6 and 7 is d, the sealed spaces 10 and 11 are constructed to satisfy $0<d/t<5$, which greatly minimizes and suppresses the fundamental wave.

Figure 2:
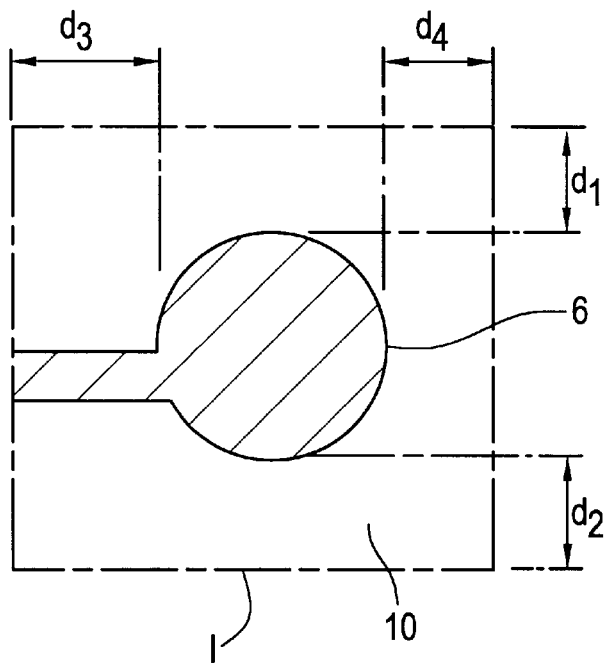
FIG. 2 is a schematic plan view to explain the shortest distance between a vibrating electrode and a sealing portion.

Here, the shortest distance to the sealing portions from the vibrating electrodes is explained in more detail with reference to FIG. 2.

The shortest distance to the sealed portion from the vibrating electrodes means the shortest distance among the distances to the surrounding sealing portion from the external edge of the vibrating electrode. For example, as shown in FIG. 2, when the vibrating electrode has a substantially circular shape and the internal edge of the sealing portion has a substantially rectangular shape (one-dot chain line), it is supposed that the portion of the vibrating electrode 6 is displaced from the center of the sealed space 10. In this case, as shown by the distances $d_1$ to $d_4$ in FIG. 2, the distance between each of the sides of the sealing portion and the vibrating electrode is different, but out of the distances $d_1$ to $d_4$, the shortest distance becomes the shortest distance d to the sealing portion from the external edge of the above vibrating electrode.

Based on a specific experimental example, it is explained that, as described above, a fundamental wave is greatly suppressed when the shortest distance d to the sealing portion from the external edge of the vibrating electrode satisfies the relationship $0<d/t<5$.

A piezoelectric substrate 5 having approximate dimensions of 3.7 mm×3.1 mm×126 μm (thickness t=126 μm) and made of PbTiO3 was used as a piezoelectric resonator element 2 in the example of preferred embodiments of the present invention. On the upper surface and lower surface of the piezoelectric substrate 5, vibrating electrodes 6 and 7 having a diameter of about 0.4 mm were formed via sputtering. Further, insulating substrates having approximate dimensions of 3.7 mm×3.1 mm×0.4 mm (thickness) made of alumina were used as sealing substrates 3 and 4. The dimension of concave portions 3a and 4a was about 1.8 mm×1.2 mm×0.2 mm (depth). The above piezoelectric resonator element 2 and sealing substrates 3 and 4 were joined and connected with epoxy resin type adhesive and external electrodes 12 and 13 were provided thereon. Thus, a piezoelectric resonator 1 with a resonance frequency of 60 MHz making use of a third harmonic of a longitudinal vibration in the thickness direction was obtained. In this piezoelectric resonator, d=0.4 mm, t=126 μm, and d/t=3.17.

Figure 3A:
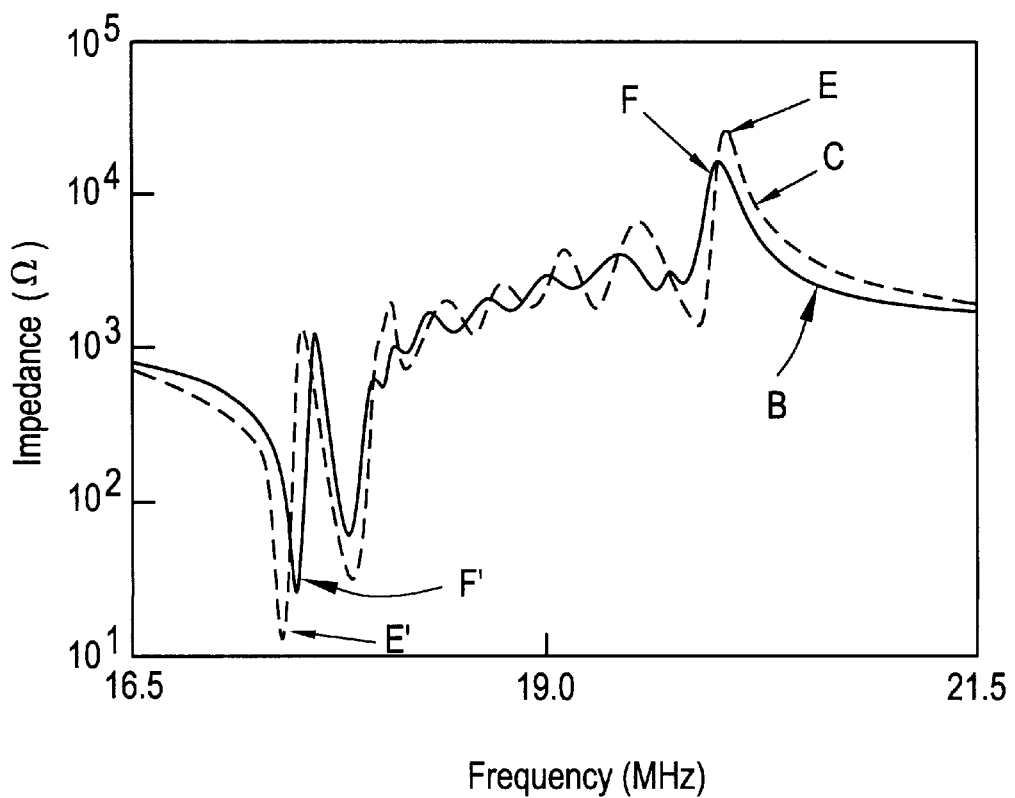
FIG. 3A illustrates impedance versus frequency characteristics of a piezoelectric resonator of a preferred embodiment and an example prepared for comparison to preferred embodiments of the present invention.
Figure 3B:
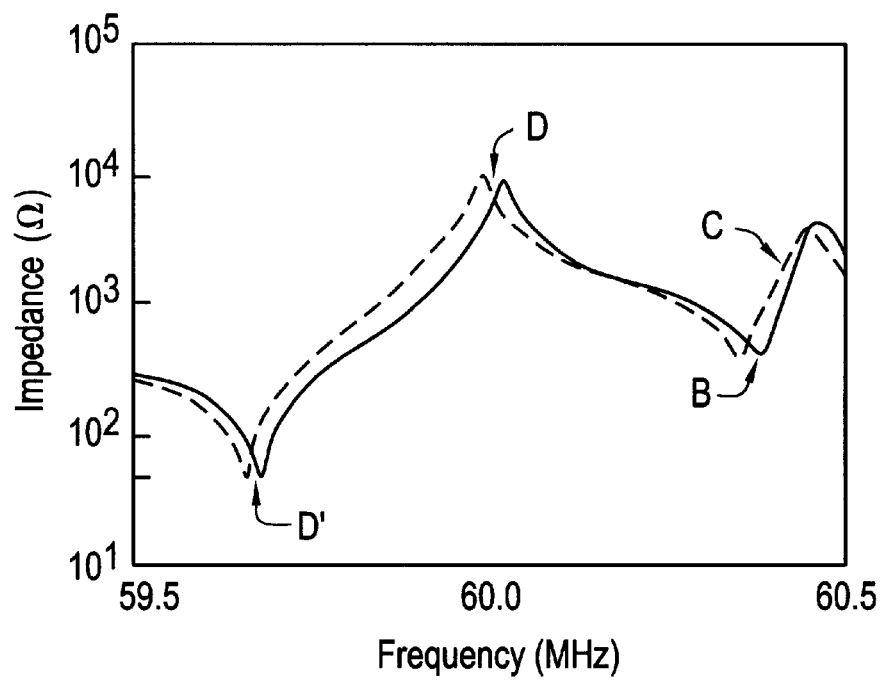
FIG. 3B illustrates responses to a fundamental wave and a third harmonic of a piezoelectric resonator of a preferred embodiment and an example prepared for comparison to preferred embodiments of the present invention.

The impedance versus frequency characteristic of the piezoelectric resonator of the above example of preferred embodiments is shown in solid line B in FIGS. 3A and 3B.

For comparison, a piezoelectric resonator was constructed in the same way as the above, except that d/t was 6.35. For comparison, the impedance versus frequency characteristic of the piezoelectric resonator is shown by broken line C in FIGS. 3A and 3B.

As shown in FIGS. 3A and 3B, in the piezoelectric resonator of the comparative example, the response of the fundamental wave shown by arrows E and E' is rather large compared with the response of a third harmonic shown by arrows D and D'. On the other hand, in the piezoelectric resonator of the example of preferred embodiments, it is understood that the response of the fundamental wave shown by arrows F and F' is greatly reduced.

The inventor of the present application has discovered that, as described above, when the sealed spaces 10 and 11 are made to satisfy the ratio of d/t in a specific range, the fundamental wave is able to be effectively suppressed. To confirm this discovery, by variously changing the above ratio of d/t, piezoelectric resonators were constructed in the same way as the above example of preferred embodiments, and their frequency characteristics were measured. The results are shown in FIG. 4.

Figure 4:
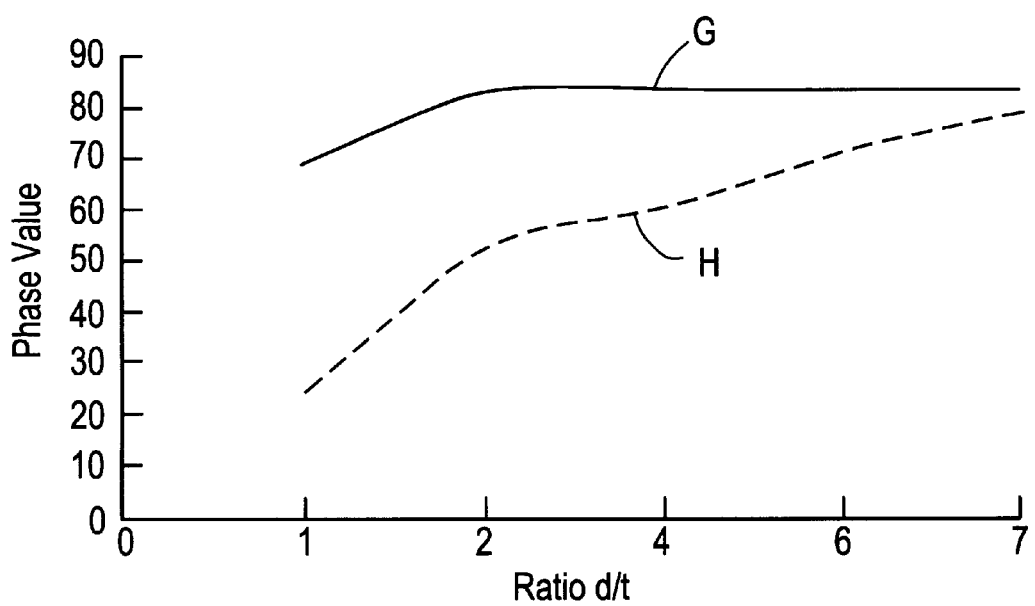
FIG. 4 shows the change of phase value of a third harmonic and the fundamental wave when the ratio of d/t is varied.

FIG. 4 shows the phase values of the third harmonic and the fundamental wave at the time when, in the piezoelectric resonator making use of a third harmonic of a longitudinal vibration in the thickness direction of preferred embodiments of the present invention, the ratio of d/t was varied.

Solid line G represents the phase value of the third harmonic and broken line H represents the phase value of the fundamental wave.

As clearly seen from FIG. 4, when the ratio d/t is less than about 5, it is understood that the response of the fundamental wave is greatly reduced. Therefore, in the energy trap type piezoelectric resonator making use of a third harmonic of a longitudinal vibration in the thickness direction, by making the ratio of d/t satisfy the relationship 0<d/t<5, it is understood that the fundamental wave can be effectively suppressed and a third harmonic of a longitudinal vibration in the thickness direction can be efficiently used.

The reason why the fundamental wave is strongly suppressed compared with a third harmonic by making the ratio of d/t less than about 5 as described above is considered to be the following. That is, the vibration area of a third harmonic is expanded in the shape of concentric circles around the vibrating electrode when the vibrating electrode has, for example, a substantially circular shape. The leaked vibration area of the fundamental wave is also expanded in the same way, but the leaked vibration area extends further than that of a third harmonic. Therefore, when the ratio of d/t is made less than about 5, the leaked vibration area of a third harmonic is not damped so much by the sealing portion and only the leaked vibration area of the fundamental wave is damped, which is considered to cause the vibration of the fundamental wave to be efficiently suppressed.

Further, the optimal dimension of the above vibration electrodes 6 and 7 is dependent on the operating frequency. However, practically it is common to form vibrating electrodes having substantially the same dimension for each of frequency bandwidths having certain ranges. Accordingly, in piezoelectric resonators of this kind, a few dimensional types of vibrating electrodes are usually made available. Therefore, as described above, regarding the sealing substrates 3 and 4 having the concave portions 3a and 4a, it is sufficient to prepare a few of kinds of sealing substrates, and it is not necessarily required to prepare a wide variety of sealing substrates.

Figure 5A:
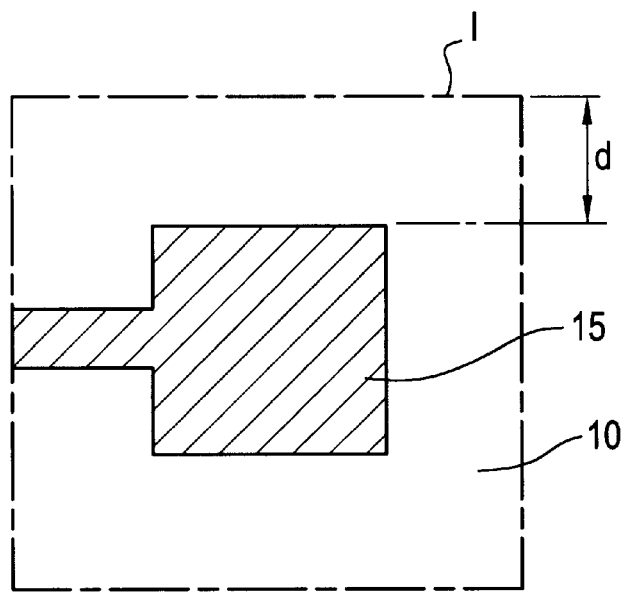
FIG. 5A is a schematic plan views showing a modification of the planar shape of a vibrating electrode and a sealing portion.

In the above-described preferred embodiment, the vibrating electrodes 6 and 7 preferably have a substantially circular shape, but as shown in FIG. 5A, vibrating electrodes may be formed to have other shapes such as a substantially rectangular shape. The one-dot chain line 1 in FIG. 5A shows the internal edge of the sealing portion. Here, the internal edge of the sealing portion preferably has a substantially rectangular shape. As a result, a sealed space is constructed to have a substantially rectangular flat shape.

Figure 5B:
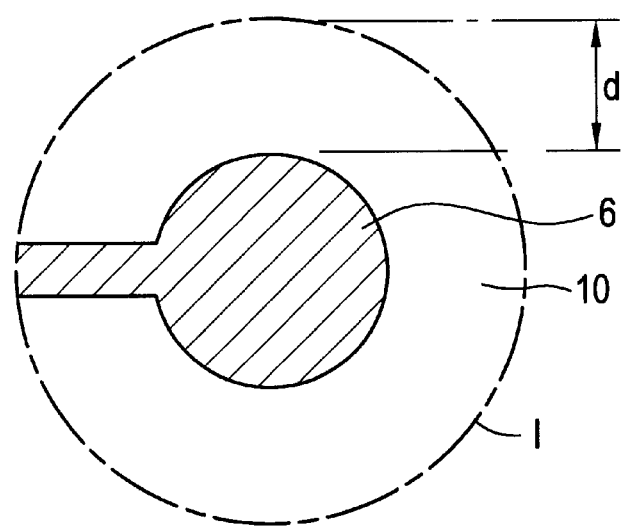
FIG. 5B is a schematic plan view showing a further modification of the planar shape of a vibrating electrode and a sealing portion.

Further, as shown in FIG. 5B, a sealing portion having an internal edge that has a substantially circular shape may be constructed together with a substantially circular vibrating electrode 6. That is, a sealed space 10 may be constructed to have a substantially circular flat shape with a substantially circular vibrating electrode 6.

Figure 6:
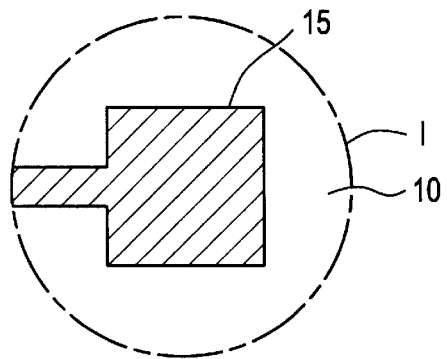
FIG. 6 is a schematic plan view showing another modification of the planar shape of a vibrating electrode and sealing portion of a piezoelectric resonator according to preferred embodiments of the present invention.

Furthermore, as shown in FIG. 6, a sealing portion of a substantially circular internal edge as shown by one-dot chain line 1 may be constructed. That is, a sealed space 10 may be formed to have a substantially circular flat shape with a substantially rectangular vibrating electrode 15.

Figure 7:
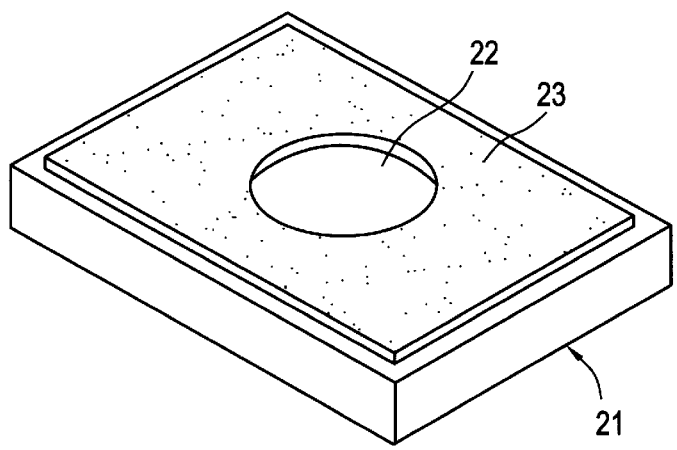
FIG. 7 is a perspective view illustrating a sealing substrate and a synthetic resin layer to be used in a piezoelectric resonator according to a modification of preferred embodiments of the present invention.
Figure 8:
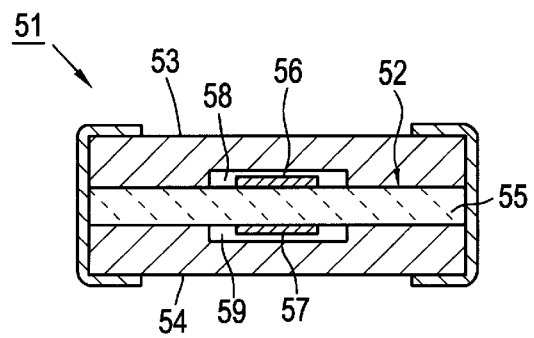
FIG. 8 is a sectional side view illustrating a conventional energy trap type piezoelectric resonator.

Further, in the piezoelectric resonator 1, the sealed spaces 10 and 11 are defined by the concave portions 3a and 4a formed in the sealing substrates 3 and 4. However, as shown in FIG. 7, on one main surface of a sealing substrate 21, a insulating layer 23 may be formed with a through-hole 22 defining a sealed space. Then, the insulating layer 23 may be formed by patterning synthetic resin, glass, or other suitable material, or by bonding an insulating plate having the through-hole 22 to the sealing substrate 21.

Furthermore, adhesive is applied preferably to have substantially the same shape as the insulating layer 23 shown in FIG. 7, and the sealing substrate 21 and piezoelectric resonator element 2 are bonded by the adhesive. Then a sealed space defined by the through-hole 22 may be formed by hardening of the adhesive. That is, with no adhesive applied in the sealed space and with the adhesive applied in the sealing portion, a sealed space and sealing potion may be constructed.

As in the above, in a piezoelectric resonator according to a first aspect of preferred embodiments of the present invention, when the thickness of the piezoelectric substrate is represented by t and the shortest distance to the sealing portion from an external edge of the first and second vibrating electrodes is d, because the sealed spaces are constructed to satisfy 0<d/t<5, the response of a third harmonic of a longitudinal vibration in the thickness direction is not substantially affected, and the fundamental wave as a spurious signal is effectively suppressed.

Accordingly, an energy trap type piezoelectric resonator making use of a third harmonic of a longitudinal vibration in the thickness direction and having excellent resonance characteristics is achieved in preferred embodiments of the present invention. Therefore, when a piezoelectric resonator of preferred embodiments of the present invention is used in a piezoelectric oscillator, etc., anomalous oscillation caused by the fundamental wave is effectively prevented.

In addition, in a piezoelectric resonator according to preferred embodiments of the present invention, it is not required to deposit or form damping material for suppressing the fundamental wave and to perform other complicated processes. Accordingly, without making the manufacturing processes complicated, a less expensive energy trap type piezoelectric resonator having excellent resonance characteristics is provided.

According to a second aspect of preferred embodiments of the present invention, because the first and second sealing substrates are joined and connected to the piezoelectric resonator preferably via adhesive, if the above-mentioned sealed spaces are constructed so that the ratio d/t is within the above-mentioned specific range, an energy trap type according to preferred embodiments of the present invention can be easily obtained by simply bonding the first and second sealing substrates to the piezoelectric resonator element.

According to a third aspect of preferred embodiments of the present invention, concave portions are provided on the side of the first and second sealing substrates which is joined and connected to the piezoelectric resonator element, and the concave portions constitute a sealed space. Accordingly, by forming the above-mentioned concave portions in accordance with the resonance frequency of the piezoelectric resonator element to be used, a piezoelectric resonator making use of a third harmonic and having the fundamental wave reliably suppressed is easily provided.

In the same way, in a piezoelectric resonator according to a fourth aspect of preferred embodiments of the present invention, insulating layers having a through-hole to constitute a sealed space are disposed between first and second sealing substrates and a piezoelectric resonator element. Accordingly, by forming the shape and dimension of the through-hole of the above-mentioned insulating layers so that the above ratio d/t is within a specific range, an energy trap type electric resonator is reliably provided.

According to a fifth aspect of preferred embodiments of the present invention, a piezoelectric resonator element and first and second sealing substrates are bonded with adhesive, and are not bonded at the portions constituting a sealed space. Accordingly, because the sealed space is constructed in the area where adhesive is not applied, by simply controlling the area where adhesive is applied, a piezoelectric resonator element according to preferred embodiments of the present invention is easily constructed.

While the invention has been particularly shown and described with reference to preferred embodiments, it will be understood by those skilled in the art that the foregoing and other changes in form and details can be made without departing from the spirit and scope of the invention.

What is claimed is:

1. An energy trap type piezoelectric resonator including:

an energy trap type piezoelectric resonator element arranged to vibrate in a third harmonic of a longitudinal vibration in a thickness direction of the resonator, the energy trap type piezoelectric resonator element including a piezoelectric substrate, first and second vibrating electrodes respectively provided on main surfaces of the piezoelectric substrate so as to face each other with the piezoelectric substrate disposed therebetween, a portion where the first and second vibrating electrodes face each other defining a vibrating portion;

first and second sealing substrates joined and connected to both main surfaces of the piezoelectric resonator element so as to sandwich the piezoelectric resonator element therebetween and so as to define sealed spaces around the first and second vibrating electrodes for allowing free vibration of the vibrating portion in the sealed spaces;

sealing portions in which the first and second substrates are joined and connected to the piezoelectric resonator element around the sealed spaces; and the sealed spaces being constructed so as to satisfy $0 < d/t < 5$ where a thickness of the piezoelectric substrate is represented by t and a shortest distance to the sealing portion from an external edge of the first and second vibrating electrodes is d.

2. The energy trap type piezoelectric resonator according to claim 1, wherein the first and second sealing substrates are joined and connected to the piezoelectric resonator element via adhesive.

3. An energy trap type piezoelectric resonator according to claim 2, wherein in the portions constituting the sealed spaces, the first and second sealing substrates are not joined and connected to the piezoelectric resonator element, and in the sealing portions, the first and second sealing substrates are joined and connected to the piezoelectric resonator element with the adhesive, so that the sealed spaces are provided around the first and second vibrating electrodes.

4. The energy trap type piezoelectric resonator according to claim 1, wherein insulating layers having a through-hole to define the sealed spaces are disposed between the first and second sealing substrates and the piezoelectric resonator element, and portions of the insulating layers around the through-holes constitute the sealing portions.

5. The energy trap type piezoelectric resonator according to claim 1, wherein the first and second vibrating electrodes have a substantially circular shape.

6. The energy trap type piezoelectric resonator according to claim 1, wherein the first and second vibrating electrodes have a substantially rectangular shape.

7. The energy trap type piezoelectric resonator according to claim 1, wherein an internal edge of each of the sealing portions has a substantially circular shape.

8. The energy trap type piezoelectric resonator according to claim 1, wherein an internal edge of each of the sealing portions has a substantially rectangular shape.

9. The energy trap type piezoelectric resonator according to claim 1, further comprising lead out electrodes connected to the vibrating electrodes.

10. The energy trap type piezoelectric resonator according to claim 9, wherein the lead out electrodes disposed on the main surfaces of the piezoelectric substrate and contact the first and second sealing substrates, respectively.

11. The energy trap type piezoelectric resonator according to claim 1, wherein the piezoelectric substrate has a substantially flat shape.

12. The energy trap type piezoelectric resonator according to claim 11, wherein the first and second sealing substrates have a substantially flat shape which is similar to the substantially flat shape of the piezoelectric substrate.

13. The energy trap type piezoelectric resonator according to claim 1, wherein the first and second sealing substrates have concave portions for defining the sealed spaces.

14. The energy trap type piezoelectric resonator according to claim 1, wherein the piezoelectric resonator element is joined to the first and second sealing portions at a position that is outside of the area defining the vibration portion.

15. The energy trap type piezoelectric resonator according to claim 1, wherein the piezoelectric substrate, the vibrating electrodes are constructed to cause the piezoelectric resonator element to highly excite the third harmonic of the longitudinal vibration.

* * * * *